(12) United States Patent
Ishikawa (10) Patent No.: US 7,445,456 B2
(45) Date of Patent: Nov. 4, 2008

(54) PRINTED CIRCUIT BOARD

(75) Inventor: Koji Ishikawa, Kawasaki (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 11/671,729

(22) Filed: Feb. 6, 2007

(65) Prior Publication Data

US 2007/0184675 A1  Aug. 9, 2007

(30) Foreign Application Priority Data

Feb. 6, 2006  (JP) .............................. 2006-028679

(51) Int. Cl.
H01R 12/00 (2006.01)
(52) U.S. Cl. ...................................................... 439/61
(58) Field of Classification Search ................... 439/61, 439/59–60, 630, 62, 634, 632, 638
See application file for complete search history.

(56) References Cited

U.S. PATENT DOCUMENTS 5,924,873 A * 7/1999 Barcley et al. ................ 439/67
6,053,746 A * 4/2000 Yoshizawa ................... 439/67
6,764,316 B1 * 7/2004 Yu ................................ 439/79
7,094,108 B2 * 8/2006 Farnworth et al. .......... 439/632
7,187,555 B2 * 3/2007 Campbell et al. ........... 361/756
7,236,358 B2 * 6/2007 Dobbs et al. ................ 361/685
7,252,537 B2 * 8/2007 Simon et al. ................ 439/489
7,261,600 B2 * 8/2007 Park ............................ 439/638

FOREIGN PATENT DOCUMENTS

JP  61-224494 A  10/1986
JP  10-173335 A  6/1998

* cited by examiner

Primary Examiner—Jean F Duverne
(74) Attorney, Agent, or Firm—Rossi, Kimms & McDowell LLP (57) ABSTRACT

A highly reliable printed circuit board which is capable of preventing a short circuit between traces from being caused by a solder bridge formed by excess solder. The printed circuit board has a solder resist covering copper foil traces formed on a substrate and the substrate, for insulation. The solder resist is formed such that exposed portions of the substrate between adjacent ones of the conductive traces each have a shape protruding in a direction of where the other printed circuit board is connected, with respect to exposed portions of the adjacent ones of the conductive traces, in a boundary between the connection part and a portion on which an insulating layer is formed.

5 Claims, 6 Drawing Sheets

PRINTED CIRCUIT BOARD

BACKGROUND OF THE INVENTION

1. Field of the Invention

The present invention relates to a printed circuit board which electrically connects exposed conductor patterns formed on a printed circuit board to each other using a conductive joining material, such as solder.

2. Description of the Related Art

Conventionally, there has been proposed a junction structure that electrically connects exposed conductor patterns formed on a printed circuit board to each other by soldering or the like (see e.g. Japanese Laid-Open Patent Publications (Kokai) No. S61-224494 and No. H10-173335). In the following, the junction structure of a conventional general printed circuit board will be described with reference to FIGS. 4A and 4B.

Figure 4A:
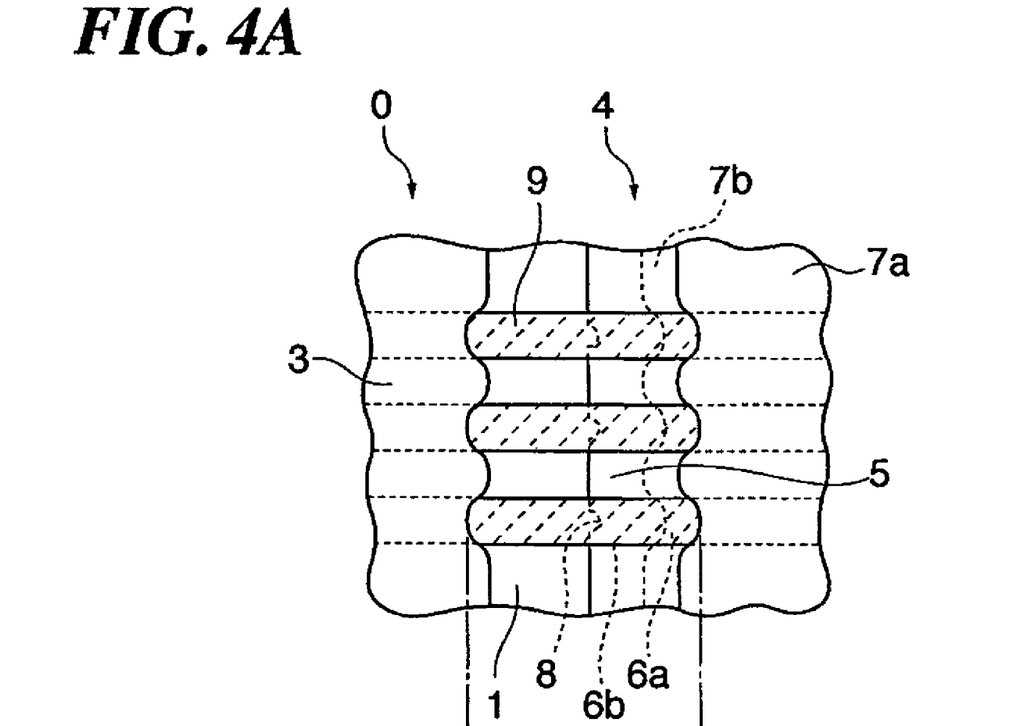
Figure 4B:
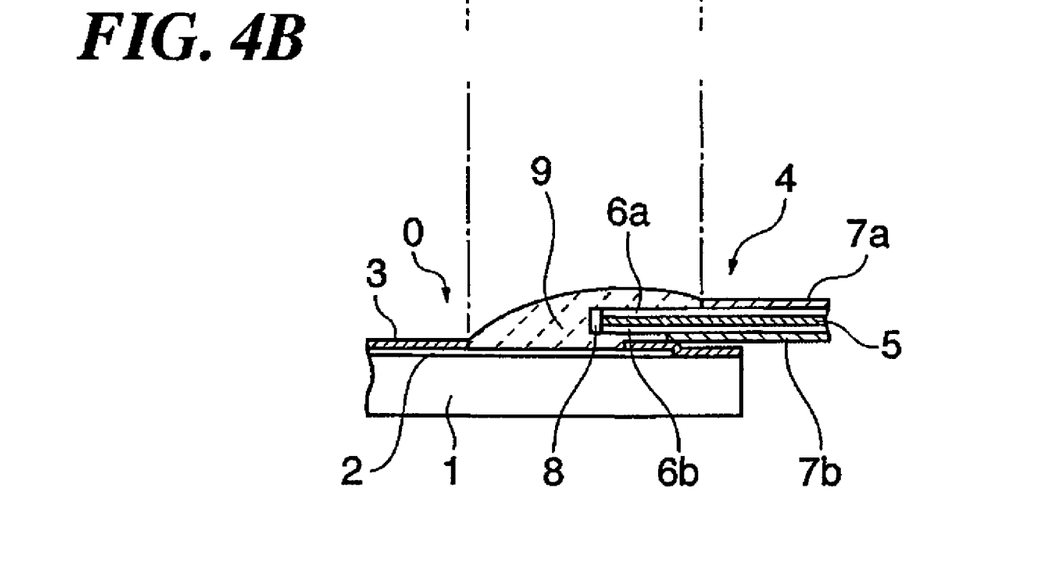
FIG. 4B is a cross-sectional view of the same.

FIGS. 4A and 4B are views showing an example of a first junction structure of the conventional printed circuit board. FIG. 4A is a top view of the first junction structure, and FIG. 4B is a cross-sectional view of the same.

In this junction structure, a conductor pattern on a rigid printed circuit board and a conductor pattern on a flexible printed circuit board are connected to each other by soldering.

In FIGS. 4A and 4B, reference numeral 0 designates the rigid printed circuit board, 1 a base substrate the base of the rigid printed circuit board 0, 2 a copper foil trace formed on the base substrate 1, 3 a solder resist, and 4 a double-sided flexible printed circuit board. Further, reference numeral 5 designates a base film, 6a a front-side copper foil trace, 6b a back-side copper foil trace, 7a a front-side cover film, 7b a back-side cover film, 8 an end-face through groove, and 9 a soldered portion.

Referring to FIG. 4A, in the junction structure of the conventional printed circuit board, the solder resist 3 covering the copper foil traces 2 on the rigid printed circuit board 0 is cut open to thereby form exposed copper foil traces on the rigid printed circuit board 0. Further, board-end portions of the respective front-side and back-side cover films 7a and 7b covering the respective front-side and back-side copper foil traces 6a and 6b extending on the respective opposite surfaces of the double-sided flexible printed circuit board 4 up to a board end thereof are cut open to thereby form exposed copper foil traces on the opposite sides of the double-sided flexible printed circuit board 4. Then, each exposed copper foil trace on the rigid printed circuit board 0 and the associated exposed copper foil traces on the flexible printed circuit board 4 are aligned one upon the other, as shown in FIGS. 4A and 4B, and are electrically connected to each other by soldering.

The copper foil traces 2 on the rigid printed circuit board 0 and the front-side and back-side copper foil traces 6a and 6b on the flexible printed circuit board 4 all have a straight shape with the same and fixed trace width, and are arranged in a plurality of lines at the same pitch.

Figure 5A:
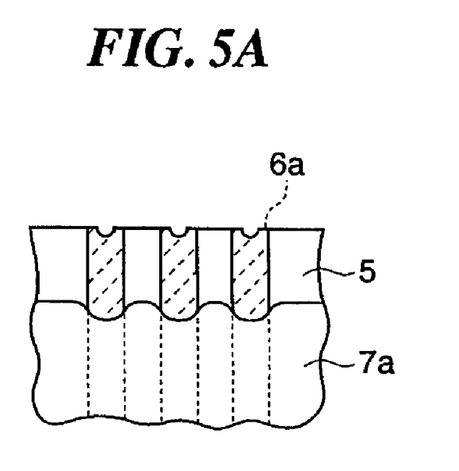
Figure 5B:
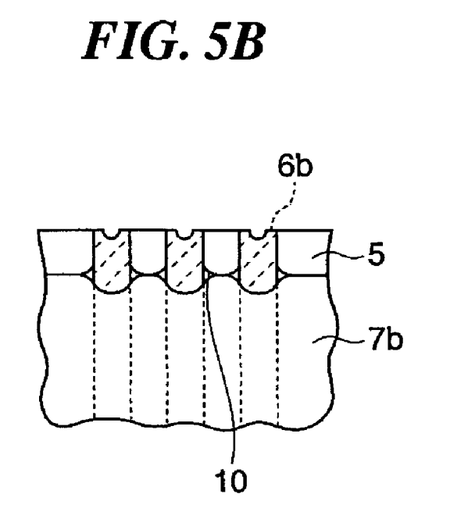
FIG. 5B is a bottom view of the same.

However, the above-described junction structure of the conventional printed circuit board suffers from the following problems:

FIGS. 5A and 5B are views of the junction structure of the printed circuit board in which the flexible printed circuit board 4 in FIGS. 4A and 4B is in the soldered state. FIG. 5A is a top view of the flexible printed circuit board 4, and FIG. 5B is a bottom view of the same.

In the junction structure shown in FIGS. 4A and 4B, if the amount of solder flowing to a back-side copper foil trace 6b on the printed circuit board 4 during an operation for soldering the exposed copper foil trace on the rigid printed circuit board 0 and the associated ones on the flexible printed circuit board 4 is too large, a short circuit can occur between the back-side copper foil trace 6b and an adjacent one. More specifically, as shown in FIG. 5B, excess solder 10 sometimes travels along the boundary edge of an opening of the back-side cover film 7b on the flexible printed circuit board 4 and reach adjacent back-side copper foil traces 6b to form solder bridges.

Even if the amount of solder is appropriate, when the flexible printed circuit board 4 is pressed by a soldering iron during the soldering operation or when a soldering robot carries out soldering while pressing the printed circuit board 4, solder on a back-side copper foil trace can be squeezed out from the back-side copper foil trace. The squeezed-out solder sometimes travels along the boundary edge of the back-side cover film 7b to cause a short circuit with an adjacent copper foil trace 6b.

Figure 6A:
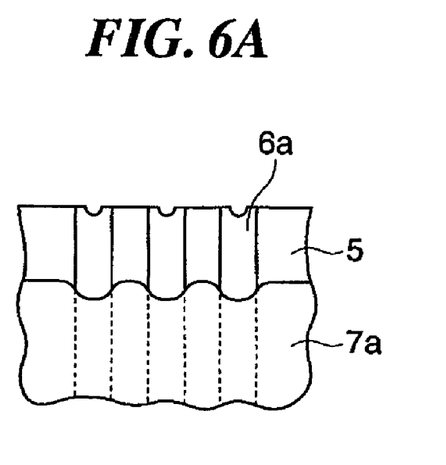
FIG. 6A is a top view of the second juncture structure.
Figure 6B:
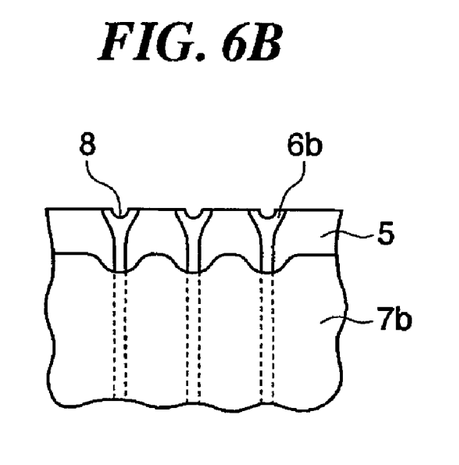
FIG. 6B is a bottom view of the same.
Figure 7A:
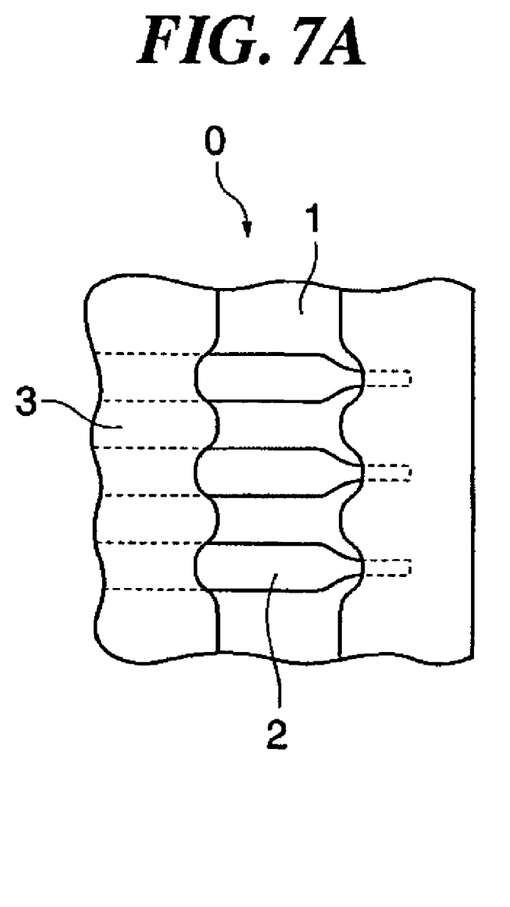
FIG. 7A shows a rigid printed circuit board.
Figure 7B:
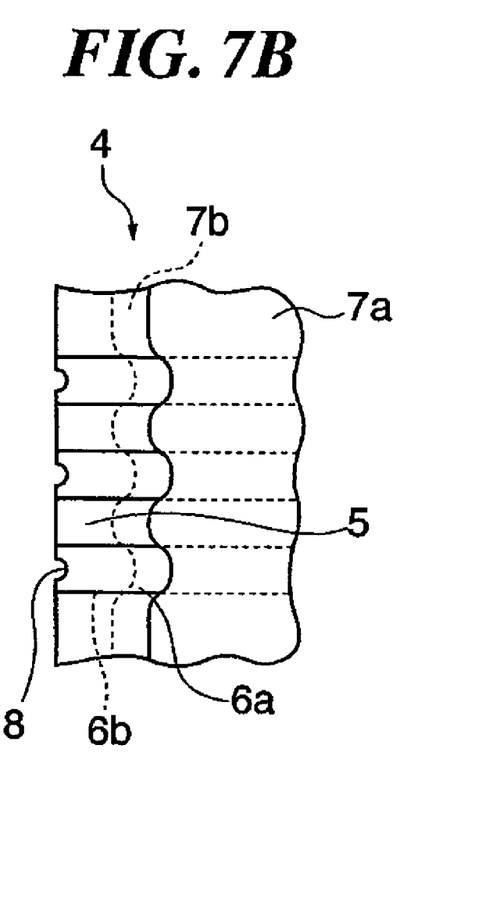
FIG. 7B shows a double-sided flexible printed circuit board.

To solve this problem, there have been proposed junction structures shown in FIGS. 6A and 6B and FIGS. 7A and 7B, for example. FIGS. 6A and 6B are views showing the shapes of copper foil traces on the flexible printed circuit board 4 in a second junction structure of a conventional printed circuit board. FIG. 6A is a top view of the second juncture structure, and FIG. 6B is a bottom view of the same. FIGS. 7A and 7B are top views of a third junction structure of a conventional printed circuit board in an unsoldered state. FIG. 7A shows a rigid printed circuit board, and FIG. 7B shows a double-sided flexible printed circuit board.

In the second junction structure shown in FIGS. 6A and 6B, each of the back-side copper foil traces 6b on the flexible printed circuit board 4, i.e. the copper foil traces on a surface of the printed circuit board 4 in facing relation to the rigid printed circuit board 0, is formed such that a boundary-side portion of each exposed back-side copper foil trace 6b toward a boundary of the back-side cover film 7b covering the trace 6b has a trace width smaller than that of a board-end portion thereof.

Further, in the third junction structure shown in FIGS. 7A and 7B, each of the exposed copper foil traces 2 on the rigid printed circuit board 0 opposed to the respective back-side copper foil traces 6b on the flexible printed circuit board 4 is formed such that a portion thereof to be covered by the printed circuit board 4 has a trace width smaller than a portion thereof opposed to the board-end portion of the printed circuit board 4.

According to the junction structures configured as shown in FIGS. 6A and 6B and FIGS. 7A and 7B, even when the amount of solder flowing in between the rigid printed circuit board 0 and the flexible printed circuit board 4 is too large, excess solder flows toward the board end of the printed circuit board 4. Therefore, solder travels along the boundary edge of the opening of the solder resist 3 from which the exposed copper foil traces are exposed, without spreading inward from the associated junctions. This prevents solder bridges from being formed between adjacent copper foil traces.

However, even in the junction structures configured as shown in FIGS. 6A and 6B and FIGS. 7A and 7B, when the amount of solder is not appropriate, or when the flexible printed circuit board 4 is pressed, solder bridging can occur, which means that neither of the junction structures is a perfect solution.

SUMMARY OF THE INVENTION

It is an object of the present invention to provide a highly reliable printed circuit board which is capable of preventing a short circuit from being caused between traces by a solder bridge formed by excess solder.

To attain the above object, in a first aspect of the present invention, there is provided a printed circuit board comprising a substrate as a base of a printed circuit board, a plurality of conductive traces formed on the substrate, an insulating layer covering the conductive traces and the substrate, for insulation, and a connection part for connection with another printed circuit board, the connection part being not covered with the insulating layer, but having the conductive traces and the substrate exposed therefrom, wherein the insulating layer is formed such that exposed portions of the substrate between adjacent ones of the conductive traces each have a shape protruding in a direction of where the other printed circuit board is connected, with respect to exposed portions of the adjacent ones of the conductive traces, in a boundary between the connection part and a portion on which the insulating layer is formed.

With the configuration of the first aspect of the present invention, the insulating layer is formed such that exposed portions of the substrate between adjacent ones of the conductive traces each have a shape protruding in a direction of where the other printed circuit board is connected, with respect to exposed portions of the adjacent ones of the conductive traces, in a boundary between the connection part and a portion on which the insulating layer is formed. Therefore, even when there is excess solder on a conductive trace, the excess solder flows into the protruding portion but not flows to reach an adjacent conductive trace.

Preferably, the conductive traces are each formed to have a trace width progressively reduced from the connection part toward the portion on which the insulating layer is formed.

To attain the above object, in a second aspect of the present invention, there is provided a printed circuit board comprising a substrate as a base of a printed circuit board, a plurality of conductive traces formed on the substrate, an insulating layer covering the conductive traces and the substrate, for insulation, and a connection part for connection with another printed circuit board, the connection part being not covered with the insulating layer but having the conductive traces and the substrate exposed therefrom, wherein the insulating layer is formed such that portions for covering between the conductive traces on the substrate each have a shape recessed in a direction of where the other printed circuit board is connected, with respect to portions for covering the conductive traces, in a boundary between the connection part and a portion on which the insulating layer is formed.

With the configuration of the second aspect of the present invention, the insulating layer is formed such that portions for covering between the conductive traces on the substrate each have a shape recessed in a direction of where the other printed circuit board is connected, with respect to portions for covering the conductive traces, in a boundary between the connection part and a portion on which the insulating layer is formed. Therefore, even when there is excess solder on a conductive trace, the excess solder flows into the recessed portion but not flows to reach an adjacent conductive trace.

Preferably, the conductive traces are each formed to have a trace width progressively reduced from the connection part toward the portion on which the insulating layer is formed.

To attain the above object, in a third aspect of the present invention, there is provided a printed circuit board comprising a substrate as a base of a printed circuit board, a plurality of conductive traces formed on the substrate, an insulating layer covering the conductive traces and the substrate, for insulation, and a connection part for connection with another printed circuit board, the connection part being not covered with the insulating layer but having the conductive traces and the substrate exposed therefrom, wherein the insulating layer is formed such that substrate portions between the insulated conductive traces are exposed in a boundary between the connection part and a portion on which the insulating layer is formed.

Preferably, the conductive traces are each formed to have a trace width progressively reduced from the connection part toward the portion on which the insulating layer is formed.

The above and other objects, features and advantages of the invention will become apparent from the following detailed description taken in conjunction with the accompanying drawings.

BRIEF DESCRIPTION OF THE DRAWINGS

FIGS. 1A and 1B are views showing a junction structure of a printed circuit board according to an embodiment of the present invention, in which FIG. 1A is a top view of the junction structure.

FIGS. 2A and 2B are views of the printed circuit board in FIGS. 1A and 1B in an unjoined state, in which FIG. 2A is a top view of the printed circuit board.

FIGS. 4A and 4B are views showing an example of a first junction structure of a conventional printed circuit board, in which FIG. 4A is a top view of the junction structure.

FIGS. 5A and 5B are views of a junction structure of a printed circuit board in which the flexible printed circuit board 4 in FIGS. 4A and 4B is in the soldered state, in which FIG. 5A is a top view of the flexible printed circuit board 4.

FIGS. 6A and 6B are views showing the shapes of copper foil traces on a flexible printed circuit board in a second junction structure of a conventional printed circuit board, in which

FIGS. 7A and 7B are top views of a third junction structure of a conventional printed circuit board in an unsoldered state, in which

DETAILED DESCRIPTION OF THE PREFERRED EMBODIMENTS

The present invention will now be described in detail below with reference to the drawings showing a preferred embodiment thereof.

A junction structure of a printed circuit board according to the present embodiment is produced by aligning a flexible printed circuit board and a rigid printed circuit board having a structure characterizing the present embodiment, one upon the other, and then electrically connecting the two by soldering. First, a description will be given of an unsoldered state of the junction structure of the printed circuit board according to the present embodiment, and then of a method of joining the rigid printed circuit board and the flexible printed circuit board.

Figure 1A:
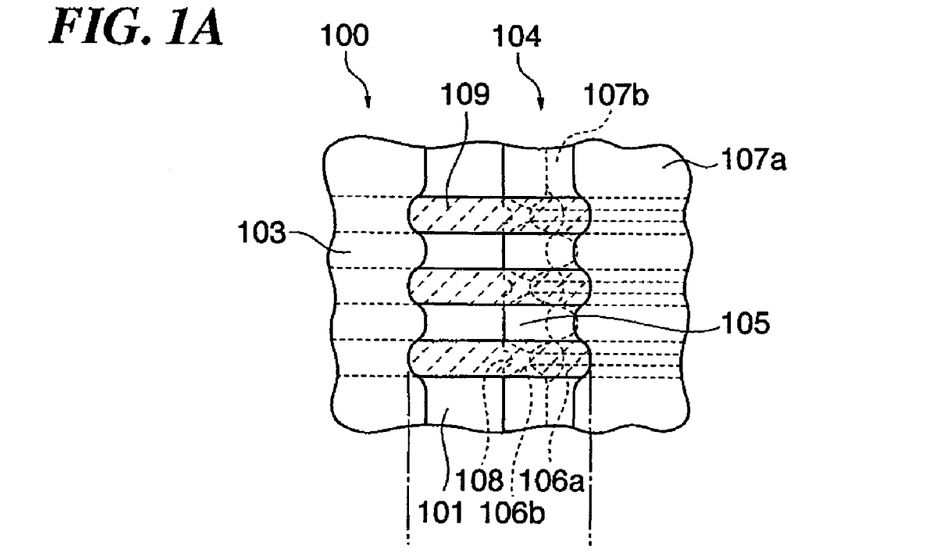
Figure 1B:
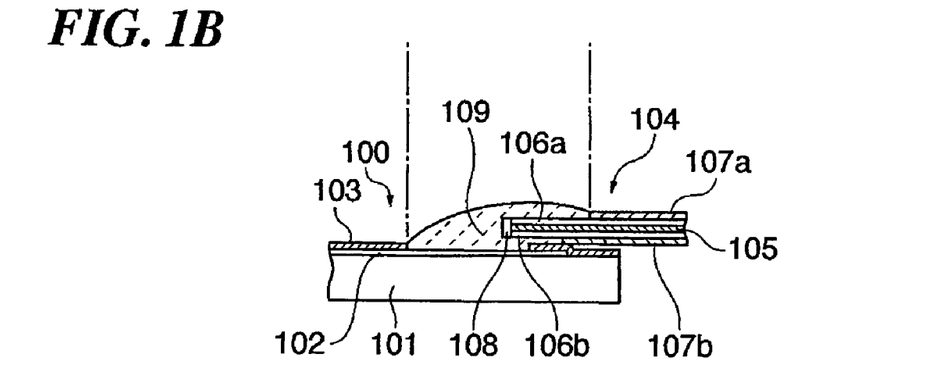
FIG. 1B is a cross-sectional view of the same.
Figure 2A:
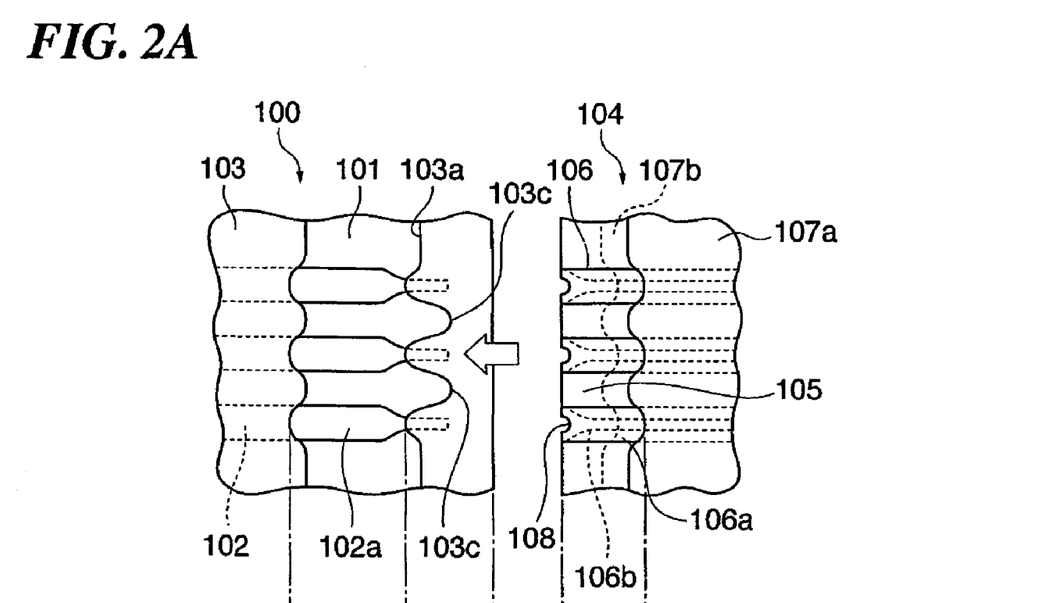
Figure 2B:
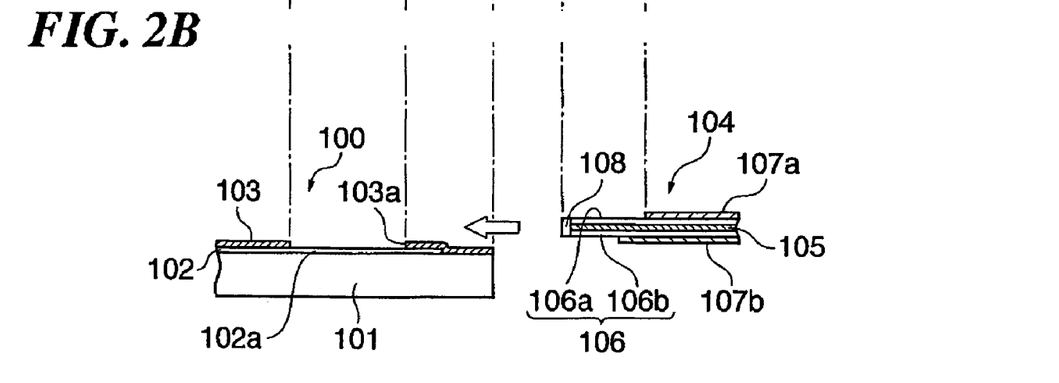
FIG. 2B is a cross-sectional view of the same.

FIGS. 1A and 1B are views of the junction structure of the printed circuit board according to the present embodiment. FIG. 1A is a top view of the junction structure, and FIG. 1B is a cross-sectional view of the same. FIGS. 2A and 2B are views of the printed circuit board in FIGS. 1A and 1B in an unjoined state. FIG. 2A is a top view of the printed circuit board, while FIG. 2B is a cross-sectional view of the same.

In FIGS. 1A and 1B and FIGS. 2A and 2B, reference numeral 100 designates a rigid printed circuit board, 101 a base substrate forming the base of the rigid printed circuit board 100, and 102 a copper foil trace formed on the upper surface of the base substrate 101, 103 a solder resist, 104 a double-sided flexible printed circuit board, and 105 a base film. Further, reference numeral 106a designates a front-side copper foil trace, 106b a back-side copper foil trace, 107a a front-side cover film, 107b a back-side cover film, and 108 an end-face through groove.

The solder resist 103 is formed such that it covers the copper foil traces 102. The solder resist 103 has an opening 103a cut open to expose the copper foil traces 102 as exposed copper foil traces 102a. The opening 103a of the solder resist 103 has edges having wave-like shapes as shown in FIG. 2A. One of the edges of the opening 103a, defining a boundary from which the flexible printed circuit board 104 is overlaid on the rigid printed circuit board 100, is shaped such that a portion of the opening 103a between each adjacent two of the exposed copper foil traces 102a protrudes toward a substrate end of the rigid printed circuit board 100 (as indicated by 103c in FIG. 2A) In other words, part of the solder resist 103 on a side where the flexible printed circuit board 104 is overlaid on the rigid printed circuit board 100 is formed such that each portion covering the associated copper foil trace 102 has a convex shape, and each portion covering the associated portion of the base substrate 101 between each adjacent two of the copper foil traces 102 has a concave shape.

On the other hand, the front-side and back-side copper foil traces 106a and 106b formed on the respective front and back surfaces of the double-sided flexible printed circuit board 104 extend up to the board end, as shown in FIGS. 2A and 2B, and each of the front-side copper foil traces 106a and the associated one of the back-side copper foil traces 106b are electrically connected to each other by the associated through groove 108. Further, the board end-side portions of the front-side and back-side cover films 107a and 107b covering the front-side and back-side copper foil traces 106a and 106b, respectively, are cut open to expose the same to thereby form exposed copper foil traces 106.

The cover film 107a (107b) has an opening whose edge is formed to have a wave-like shape, as shown in FIG. 2A, and portions of the cover film 107a (107b) overlapping the copper foil traces 106a (106b), respectively, have a recessed shape, and a portion between adjacent two of the copper foil traces 106a (106b) has a protruding shape. In other words, edge portions of the cover film 107a (107b) overlapping the respective exposed copper foil traces 106 have the recessed shape, and edge portions of the cover film 107a (107b) between the exposed copper foil traces 106 have the protruding shape. Further, as shown in FIG. 2B, boundary edges of the openings of the respective front-side and back-side cover films 107a and 107b are defined such that they are vertically displaced from each other. More specifically, the boundary edge of the opening of the back-side cover film 107b is shifted toward the end of the flexible printed circuit board 104 with respect to the boundary edge of the opening of the front-side cover film 107a. It is preferred that this shift amount is set by taking into account an error in affixing the cover film, which can occur in manufacturing of the flexible printed circuit board.

As shown in FIG. 2A, each of the exposed copper foil traces 102a on the rigid printed circuit board 100 is formed to have a trace width progressively reduced in a boundary (from which the rigid printed circuit board 100 starts to be covered by the flexible printed circuit board 104 when the boards are joined to each other) with the solder resist 103. On the other hand, each of the back-side copper foil traces 106b on the flexible printed circuit board 104 is formed such that a board end-side portion thereof has the same trace width as that of the associated one of the exposed copper foil traces 102a on the rigid printed circuit board 100 and that of the associated one of the exposed front-side copper foil trace 106a on the flexible printed circuit board 104. Further, the boundary portion of the back-side copper foil traces 106b covered by the back-side cover film 107b has a trace width smaller than that of the board end-side portion of the same.

Next, a description will be given of an example of a method of forming the solder resist 103.

FIGS. 3A to 3D constitute a process diagram showing the method of forming the solder resist 103 having the wave-shaped opening 103a characterizing the present embodiment.

Figure 3A:
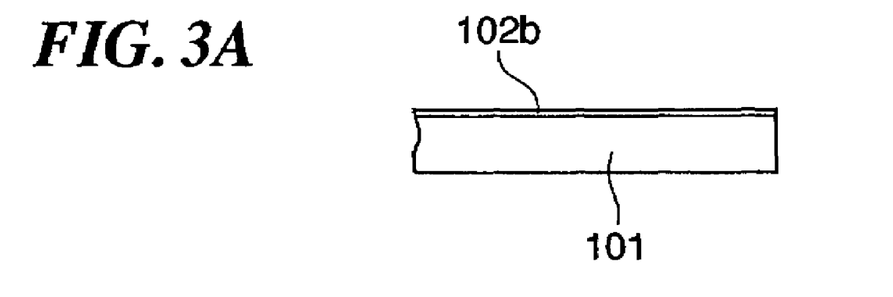
FIGS. 3A to 3D constitute a process diagram showing a method of forming a solder resist.
Figure 3B:
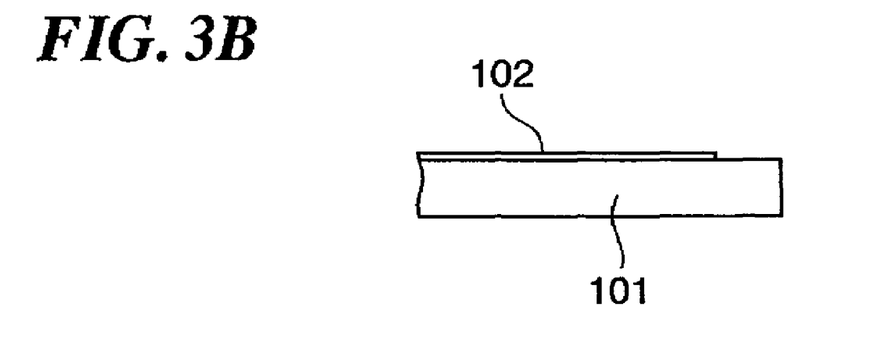

First, the base substrate 101 having copper foil 102b formed all over the upper surface thereof is prepared (FIG. 3A). Then, the copper foil 102b on the base substrate 101 is patterned e.g. using the conventional wet etching technique, whereby the copper foil traces 102 of a copper foil pattern are formed (FIG. 3B).

Figure 3C:
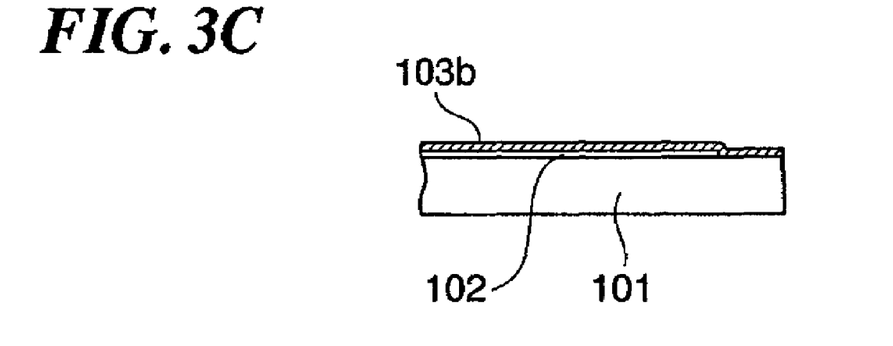

Next, a photoresist film 103b is applied to the entire surface of the base substrate 101 having the copper foil traces 102 formed thereon (FIG. 3C). Then, this photoresist film 103b is exposed to light and developed, whereby a resist pattern corresponding to the solder resist 103 having the wave-shaped opening 103a is formed.

Figure 3D:
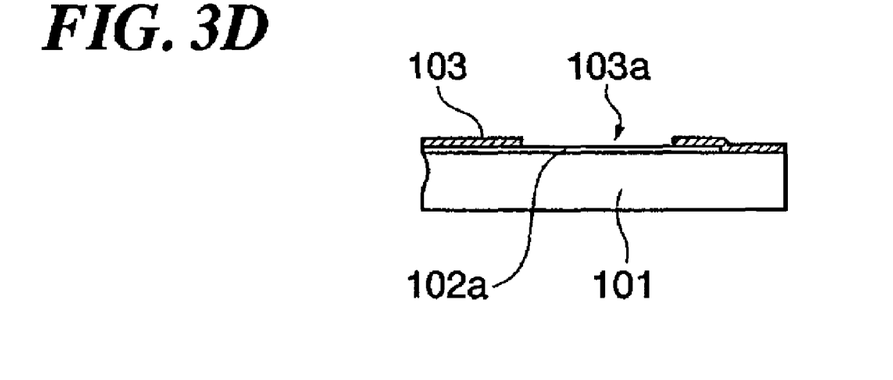

Thereafter, the base substrate 101 having the copper foil traces 102b formed thereon is etched e.g. using the dry etching technique, with the resist pattern as a mask, whereby the solder resist 103 having the wave-shaped opening 103a is formed on the base substrate 101 (FIG. 3D). At this time, the copper foil pattern traces 102 are exposed in the opening 103a, as the exposed copper foil traces 102a.

Although in the present embodiment, the photoetching technique is used as a method of forming the solder resist 103, by way of example, this is not limitative.

Next, a description will be given of a method of joining the rigid printed circuit board 100 and the flexible printed circuit board 104 to each other.

The flexible printed circuit board 104 is positioned with respect to the rigid printed circuit board 100, as shown in FIGS. 1A and 1B, such that the exposed back-side copper foil traces 106b on the flexible printed circuit board 104 faces the upper surfaces of the respective exposed copper foil traces 102a on the rigid printed circuit board 100. The length of each of the exposed copper foil traces 102a on the rigid printed circuit board 100 exposed in this state is set such that it is substantially equal to the length of each of the exposed front-side copper foil traces 106a on the flexible printed circuit board 104. By setting the above-mentioned two trace lengths to substantially the same length, it is possible to make the amount of solder on the exposed copper foil trace 102a on the rigid printed circuit board 100 and that of solder on the exposed copper foil trace 106 on the flexible printed circuit board 104 equal to each other, which facilitates soldering work.

The positioning of the flexible printed circuit board 104 with respect to the rigid printed circuit board 100 is performed e.g. in the following process: First, positioning holes (dowel holes) are formed at respective two locations close to the to-be-soldered portion of each of the rigid printed circuit board 100 and the flexible printed circuit board 104, and at the same tine two bosses (dowel pins) are formed on a member to which the rigid printed circuit board 100 is to be fixed. Then, the rigid printed circuit board 100 and the flexible printed circuit board 104 are only required to be positioned with respect to the bosses. In this case, the diameter of the positioning hole formed through the flexible printed circuit board 104 is set to be smaller than the diameter of the boss so as to press-fit the boss in the positioning hole utilizing the flexibility of the flexible printed circuit board 104. This makes it possible to provisionally fix the flexible printed circuit board 104 simply by fitting the positioning holes on the bosses, which eliminates the need for holding the flexible printed circuit board 104 by hand during soldering work. Alternatively, a positioning jig may be used for determining a relative position between the rigid printed circuit board 100 and the flexible printed circuit board 104.

Thus, the flexible printed circuit board 104 is positioned with respect to the rigid printed circuit board 100. Then, each of the exposed copper foil traces 102a on the rigid printed circuit board 100 and the associated one of the exposed copper foil traces 106 on the flexible printed circuit board 104 are electrically connected to each other by soldering work, whereby the state shown in FIGS. 1A and 1B is obtained.

Next, a description will be given of advantageous effects provided by the present embodiment in the soldering work.

If the amount of solder supplied during the soldering work is too large, excess solder caught between the rigid printed circuit board 100 and the flexible printed circuit board 104 attempts to travel and spread along the boundary edge of the opening 103a of the solder resist 103. However, as described hereinbefore, the opening 103a of the solder resist 103 has the boundary edge thereof shaped such that a portion between adjacent two of the exposed copper foil traces 102a projects toward the substrate end of the rigid printed circuit board 100 (103c in FIG. 2A). This shape makes it possible to obtain a sufficiently long boundary edge portion to prevent excess solder from reaching the associated adjacent copper foil trace 102, thereby reliably preventing occurrence of a short circuit between the traces due to occurrence of solder bridging.

In general, if solder is not attached to the end face of the flexible printed circuit board 104 in the soldering work, there is formed a boundary of solder in the boundary between the rigid printed circuit board 100 and the flexible printed circuit board 104. This can result in an insufficient amount of solder supplied to solder bonding surfaces, which can cause insufficient connection or make it impossible to obtain sufficient connection strength, leading to peeling of solder. However, in the present embodiment, the flexible printed circuit board 104 has the end face thereof formed with the end-face through grooves 108 for connection between the respective front-side and back-side copper foil traces 106a and 106b, and through-hole plating is applied to the substrate end face, so that solder is reliably attached even to the substrate end face, and further, solder flows in between each of the exposed back-side copper foil traces 106b on the flexible printed circuit board 104 and the associated one of the exposed copper foil traces 102a on the rigid printed circuit board 100. This ensures an excellent soldered condition.

Further, as described hereinbefore, each of the exposed copper foil traces 102a on the rigid printed circuit board 100 is formed to have a trace width progressively reduced in the boundary with the solder resist 103, and each of the back-side copper foil traces 106b on the flexible printed circuit board 104 is formed such that a board end-side portion thereof has the same trace width as that of the associated exposed front-side copper foil trace 106a and the boundary portion thereof covered by the back-side cover film 107b has a trace width smaller than that of the board end-side portion. As a consequence, even when the amount of solder flowing in between each exposed copper foil trace 102a on the rigid printed circuit board 100 and the associated exposed back-side copper foil trace 106b on the flexible printed circuit board 104 is too large, excess solder flows back toward the board end of the flexible printed circuit board 104. Therefore, it is possible to reduce the amount of solder traveling along the boundary edge of the opening of the cover film 107b.

Further, in the case where it is required to carry out soldering work while holding the flexible printed circuit board 104 by a soldering iron or where an automatic soldering robot carries out soldering work while holding the flexible printed circuit board 104, the present embodiment provides the following advantageous effect: In such a case, solder between an exposed copper foil trace 102a on the rigid printed circuit board 100 and the associated exposed back-side copper foil trace 106b on the flexible printed circuit board 104 is pressed to be caused to attempt to flow out from the copper foil trace. However, excess solder flows back toward the board end of the flexible printed circuit board 104, and hence flows inward from the junction. Therefore, it is possible to reduce the amount of solder flowing along the boundary edge of the opening of the cover film 107b.

Furthermore, as described hereinbefore, the boundary edges of the open ends of the respective front-side and back-side cover films 107a and 107b are defined such that they are vertically displaced from each other. More specifically, the boundary edge of the opening of the back-side cover film 107b is shifted toward the board end of the flexible printed circuit board 104 with respect to the boundary edge of the opening of the front-side cover film 107a. This makes it possible to avoid the following inconvenience: There is a case where after completion of soldering, force for bending the flexible printed circuit board 104 is repeatedly applied to the other end of the flexible printed circuit board 104 opposite from the soldered part of the same to thereby apply stress to the boundary portions between the soldered part and the opening edges of the respective cover films. Even then, in the present embodiment, stress is prevented from being applied to the vertically aligned portions of the front and back of the flexible printed circuit board 104, and hence it is possible to prevent disconnection of a copper foil trace or breaking of the flexible printed circuit board 104.

Although in the present embodiment, the rigid printed circuit board and the flexible printed circuit board are joined to each other, it is to be understood that the same advantageous effects as described above can also be obtained when two rigid printed circuit boards are joined to each other, or when two flexible printed circuit boards are joined to each other.

Further, the junction structure of the printed circuit board according to the present embodiment is configured to be capable of preventing solder bridging between adjacent traces, and therefore it is suited to connection between printed circuit boards in any kind of electronic equipment, particularly to soldering connection of terminals arranged at a narrow pitch on flexible printed circuit boards within a small-sized apparatus, such as a digital camera or a video camcoder.

While the present invention has been described with reference to exemplary embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application No. 2006-028679, filed Feb. 6, 2006 which is hereby incorporated by reference herein in its entirety.

What is claimed is:

1. A printed circuit board comprising:
   a substrate as a base of the printed circuit board;
   a plurality of conductive traces formed on said substrate;
   an insulating layer partially covering said conductive traces and said substrate; and
   a connection part for connection with another printed circuit board, wherein said conductive traces and said substrate are not covered with said insulating layer at the location of the connection part; and
   wherein said insulating layer is formed such that exposed portions of said substrate between adjacent ones of said conductive traces each have a shape protruding in a direction of where the other printed circuit board is connected, with respect to exposed portions of the adjacent ones of said conductive traces, in a boundary between said connection part and a portion on which said insulating layer is formed.

2. A printed circuit board according to claim 1, wherein said conductive traces are each formed to have a trace width progressively reduced from said connection part toward the portion on which said insulating layer is formed.

3. A printed circuit board comprising:
   a substrate as a base of the printed circuit board;
   a plurality of conductive traces formed on said substrate;
   an insulating layer partially covering said conductive traces and said substrate; and
   a connection part for connection with another printed circuit board, wherein said conductive traces and said substrate are not covered with said insulating layer at the location of the connection part; and
   wherein said insulating layer is formed such that portions for covering between said conductive traces on said substrate each have a shape recessed in a direction of where the other printed circuit board is connected, with respect to portions for covering said conductive traces, in a boundary between said connection part and a portion on which said insulating layer is formed.

4. A printed circuit board according to claim 3, wherein said conductive traces are each formed to have a trace width progressively reduced from said connection part toward the portion on which said insulating layer is formed.

5. A printed circuit board comprising:
   a substrate as a base of the printed circuit board;
   a plurality of conductive traces formed on said substrate;
   an insulating layer partially covering said conductive traces and said substrate; and
   a connection part for connection with another printed circuit board, wherein said conductive traces and said substrate are not covered with said insulating layer at the location of the connection part;
   wherein said insulating layer is formed such that exposed portions of the substrate between said conductive traces project toward a substrate end of said other printed circuit board within a boundary between said connection part and a portion on which said insulating layer is formed; and
   wherein said conductive traces are each formed to have a trace width progressively reduced from said connection part toward the portion on which said insulating layer is formed.

* * * * *